United States Patent
Miyazawa

(10) Patent No.: US 8,388,394 B2
(45) Date of Patent: Mar. 5, 2013

(54) METHOD OF REPAIRING ORGANIC EL DISPLAY

(75) Inventor: Kazutoshi Miyazawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/472,565

(22) Filed: May 16, 2012

(65) Prior Publication Data

US 2012/0295507 A1    Nov. 22, 2012

(30) Foreign Application Priority Data

May 17, 2011    (JP) .................................. 2011-109991

(51) Int. Cl.
*H01L 21/00*    (2006.01)
*H01J 9/50*    (2006.01)

(52) U.S. Cl. ............................................. 445/2; 445/61

(58) Field of Classification Search .................. 445/2, 3, 445/24, 61, 62; 315/169.1–169.4; 438/4, 438/12

See application file for complete search history.

(56) References Cited

U.S. PATENT DOCUMENTS

| | | | | |
|---|---|---|---|---|
| 5,902,678 A | * | 5/1999 | Konda et al. | 428/345 |
| 2004/0082252 A1 | * | 4/2004 | Liao et al. | 445/61 |
| 2004/0202777 A1 | * | 10/2004 | Nishikawa et al. | 427/66 |

FOREIGN PATENT DOCUMENTS

| | | |
|---|---|---|
| JP | 4-367295 | 12/1992 |
| JP | 2004-119243 | 4/2004 |

* cited by examiner

*Primary Examiner* — Joseph L Williams
(74) *Attorney, Agent, or Firm* — Panasonic Patent Center

(57) ABSTRACT

In a method of repairing an organic EL display, in which when a foreign particle has contaminated a pixel electrode to cause a defect during manufacture of an organic EL display, it is possible to repair the defect locally and simply without damaging the vicinity of the repaired part of the pixel electrode by the repair. In manufacture of the organic EL display, a defect due to a foreign particle is repaired by detecting the foreign particle that has contaminated the pixel electrode, lowering a fine needle having a hemispherically-shaped tip downward toward the foreign particle, and plastic deforming the foreign particle and part of the pixel electrode together to bury the foreign particle into the pixel electrode. A short circuit due to a foreign particle is prevented by pressing the foreign particle into the pixel electrode.

6 Claims, 12 Drawing Sheets

(A)

(B)

(C)

METHOD OF REPAIRING ORGANIC EL DISPLAY

CROSS REFERENCE TO RELATED APPLICATIONS

This application is entitled to and claims the benefit of Japanese Patent Application No. 2011-109991, filed on May 17, 2011, the disclosure of which including the specification, drawings and abstract is incorporated herein by reference in its entirety.

TECHNICAL FIELD

The technical field relates to a method of repairing an organic EL display. In particular, the technical field relates to a method of repairing an organic EL display, in which when a foreign particle enters a pixel electrode or is attached on the surface of the pixel electrode during manufacture of the organic EL display, a defect due to the foreign particle that may cause a short circuit is repaired.

BACKGROUND ART

In recent years, expectations for a self-luminescent organic EL display using organic EL elements as the next-generation display have been grown. The organic EL display is self-luminescent and displays bright and vivid images. For this reason, the organic EL display has excellent features such as a wide viewing angle and high response speed. Further, because the organic EL display does not need a backlight, a thin display can be made advantageously and easily. Therefore, application of the organic EL display to, for example, TVs having a large display in future has been expected.

The organic EL elements constituting the organic EL display can be formed on the surface of an insulation film on a TFT substrate. Each of the organic EL elements includes a pixel electrode arranged on the insulation film, an organic functional layer containing fluorescent molecules that is arranged on the pixel electrode, and a counter electrode arranged on the organic functional layer.

In recent years, as the organic EL display becomes larger and features higher definition, it becomes more likely that a foreign particle contaminates the pixel electrode when the pixel electrode is formed on the insulation film on the TFT substrate. In the case where a foreign particle contaminates the pixel electrode, when the organic functional layer and the counter electrode are formed over the pixel electrode, the pixel electrode and the counter electrode are electrically connected via the foreign particle. For this reason, when a current is applied to the organic EL element, a short circuit may occur due to the foreign particle. When a short circuit occurs, a current does not pass through the organic functional layer on this pixel electrode. Therefore, the organic functional layer does not emit light, and thus the pixel having the foreign particle becomes a defective pixel. Further, due to a short circuit, the larger amount of current that does not contribute to light emission passes between the pixel electrode and the counter electrode. Accordingly, the efficiency of light emission of the organic EL element is lowered.

In order to overcome the above problem, various methods have been suggested in which, when a foreign particle contaminates the electrode or the like, the pixel electrode or the organic functional layer is repaired by removing this foreign particle (for example, see Patent Literatures 1 and 2).

A repairing method of Patent Literature 1 is shown in FIG. 9. Patent Literature 1 discloses a method of removing foreign particle 2 by placing rotation tool 4 in contact with electrode pad 1 having the foreign particle 2. Rotation tool 4 has roughened grinding surface 3 on the surface of the tip thereof. Patent Literature 1 also suggests removing a foreign particle by releasing an abrasive liquid from an abrasive outlet provided on the tip of the rotation tool and grinding the electrode pad with the abrasive liquid.

A repairing method of Patent Literature 2 is shown in FIG. 10. Patent Literature 2 discloses repairing a pixel by irradiating foreign particle 2 that has contaminated organic layer 5 of an organic EL element with laser 7 emitted from laser oscillator 6 to remove the foreign particle 2 together with part of the organic layer around the foreign particle 2. Foreign particle 2 is irradiated with laser 7 by focusing laser 7 using objective lens 8 or the like according to the size of the foreign particle.

Other methods for removing a foreign particle are also known: a method in which a foreign particle is electrically isolated by irradiating part of a pixel electrode around the foreign particle with a high energy ray such as laser light (for example, see Patent Literatures 3 to 5), a method in which the organic functional layer of a pixel containing a foreign particle is peeled using an adhesive and the pixel is re-supplied with material ink of the organic functional layer (for example, see Patent Literature 6), a method in which a foreign particle is removed from a pixel by attaching the foreign particle in the pixel to an adhesive tape and peeling the adhesive tape from the pixel (for example, see Patent Literature 7), and a method in which an additional organic EL layer or an insulation layer is formed on a foreign particle in an organic EL layer (for example, see Patent Literature 8).

CITATION LIST

Patent Literature

PTL 1
Japanese Patent Application Laid-Open No. 4-367295
PTL 2
Japanese Patent Application Laid-Open No. 2004-119243
PTL 3
Japanese Patent Application Laid-Open No. 2004-227852
PTL 4
U.S. Patent Application Publication No. 2004/0202777
PTL 5
U.S. Patent Application Publication No. 2004/0082252
PTL 6
Japanese Patent Application Laid-Open No. 2011-48984
PTL 7
U.S. Pat. No. 5,902,678
PTL 8
Japanese Patent Application Laid-Open No. 2011-48984

SUMMARY

Technical Problem

However, in the method of Patent Literature 1, because the rotation tool is placed in contact with the electrode pad to remove a foreign particle, the foreign particle is mechanically crushed, as shown in FIG. 11. For this reason, it is likely that pieces 9 produced after grinding remain as residues on the electrode pad around place 10 in which the foreign particle was present.

When the residues of pieces of the foreign particle exist on the pixel electrode after grinding of the foreign particle, these pieces become foreign particles, inducing a defect of the pixel. Further, grinding may damage the surface of the pixel electrode and thus the reflection surface of the pixel electrode may be roughened. In the case where the pixel electrode has flaws, when the organic functional layer is made to emit light, the efficiency of light reflection at the pixel electrode is lowered, lowering the luminance of the pixel. When an abrasive liquid is used, the abrasive liquid itself may adversely affect the pixel electrode and may impair the performance of the pixel electrode, such as resistance value. Further, because the size of the pixel electrode of an organic EL display is extremely small, it is difficult to employ a rotation tool having a grinding surface at its tip.

In the method of Patent Literature 2, pieces 9 of a foreign particle after laser irradiation spread out around the part that has been irradiated with laser, as shown in FIG. 12, and thus pieces 9 may become foreign particles that may induce a defect of the pixel. Further, by heat of the laser, burrs may be formed around part 12 in which the foreign particle is removed by irradiation with laser. These burrs 11 may become the cause of a defect, that is, may become a contact point with the counter electrode, and thus may cause a short circuit. Further, the vicinity of the part that has been irradiated with laser is damaged by heat of the laser.

In view of the above-discussed problems, as well as other concerns, the present application concerns a method of repairing an organic EL display that can locally repair a defect due to a foreign particle that may cause a short circuit without adversely affecting part of a pixel electrode around the foreign particle, for example, without damaging the part around the foreign particle when the foreign particle enters the pixel electrode or is attached on the surface of the pixel electrode.

Solution to Problem

In order to accomplish the above purpose, a method of repairing an organic EL display includes as discussed below.

[1] A method of repairing an organic EL display, the method applied for manufacturing an organic EL display having a substrate having a drive circuit with TFTs and multiple organic EL elements arranged in the form of matrix on the substrate, each of the organic EL elements including a pixel electrode arranged on the substrate, an organic layer arranged on the pixel electrode and a counter electrode arranged on the organic layer, the method comprising:

forming the pixel electrode on the substrate at a position of each of the organic EL elements;

detecting a foreign particle that has contaminated the pixel electrode; and pressing the foreign particle into the pixel electrode.

[2] The method of repairing the organic EL display according to [1], wherein when pressing the foreign particle into the pixel electrode, a fine needle having a hemispherically-shaped tip is moved downward toward the foreign particle such that the foreign particle and part of the pixel electrode are plastic-deformed together to bury the foreign particle into the pixel electrode.

[3] The method of repairing the organic EL display according to [1], wherein when pressing the foreign particle into the pixel electrode, a roll is pressed against a surface of the substrate while relatively moving the substrate with respect to the roll such that the foreign particle that has protruded from the pixel electrode is plastic-deformed to make a surface of the pixel electrode flat.

[4] The method of repairing an organic EL display according to [1], further comprising forming an insulation film on the substrate, wherein when forming the pixel electrode on the substrate, the pixel electrode is formed on the insulation film at a position of each of the organic EL elements.

Advantageous Effects

When a foreign particle contaminates a pixel electrode, the method according to various embodiments discussed above makes it possible to simply remove the foreign particle protruding from the surface of the pixel electrode by pressing the foreign particle into the pixel electrode. Further, because the foreign particle is simply pressed into the pixel electrode, part of the pixel electrode around the foreign particle is not damaged, and the foreign particle does not break into fragments upon trying to remove the foreign particle. Therefore, it is possible to locally repair the pixel electrode without adversely affecting the pressed part of the pixel electrode at around the foreign particle.

DESCRIPTION OF EMBODIMENTS

Various embodiments of a method for repairing an organic EL panel will be described in detail with reference to the accompanying drawings.

1. Method of Repairing Organic EL Panel

The method achieves advantageous effects in particular when manufacturing large organic EL displays. This is because, when large organic EL displays are manufactured, it becomes more likely that pixel electrodes have defects. When a foreign particle contaminates the pixel electrode and thus a short circuit occurs between the pixel electrode and the counter electrode via the foreign particle, it becomes more likely that a pixel having such the pixel electrode does not emit light. Or, as the amount of current passing between the two electrodes increases due to a leakage, it becomes more likely that the efficiency of light emission is decreased.

A method of repairing an organic EL display may include:
(1) a first step of forming an insulation film on a substrate having a drive circuit with TFTs,
(2) a second step of forming a pixel electrode on the insulation film at a position of each of organic EL elements,
(3) a third step of detecting a foreign particle that has contaminated the pixel electrode, and
(4) a fourth step of pressing the foreign particle that has contaminated the pixel electrode into the pixel electrode.
Each step will be described below.
(1) In the first step, a substrate (hereinafter also referred to as "TFT substrate") having a drive circuit with TFTs is provided. The TFT substrate has the drive circuit with thin film transistors arranged in the form of matrix on the substrate. The insulation film is formed on the TFT substrate so as to cover TFTs. The insulation film is flat, and the pixel electrodes are formed on a surface of the insulation film.

The insulation film can be formed by applying a resin material as an insulation film material, on the TFT substrate and curing the resin material. Examples of the resin material to be applied include photosensitive resins, for example. Therefore, the insulation film is made of, for example, cured photosensitive resins.
(2) In the second step, the pixel electrodes are patterned, for example, in the form of matrix on the surface of the insulation film on the TFT substrate. The pixel electrodes can be patterned in the form of matrix on the TFT substrate by depositing a metal film made of the pixel electrode material over the entire surface of the insulation film by sputtering or vapor deposition, for example, and then by etching the deposited metal film by photolithography, for example.

A foreign particle may contaminate the pixel electrode during forming the pixel electrode, in particular upon depositing the metal film on the TFT substrate by sputtering or vapor deposition.

Figure 6:
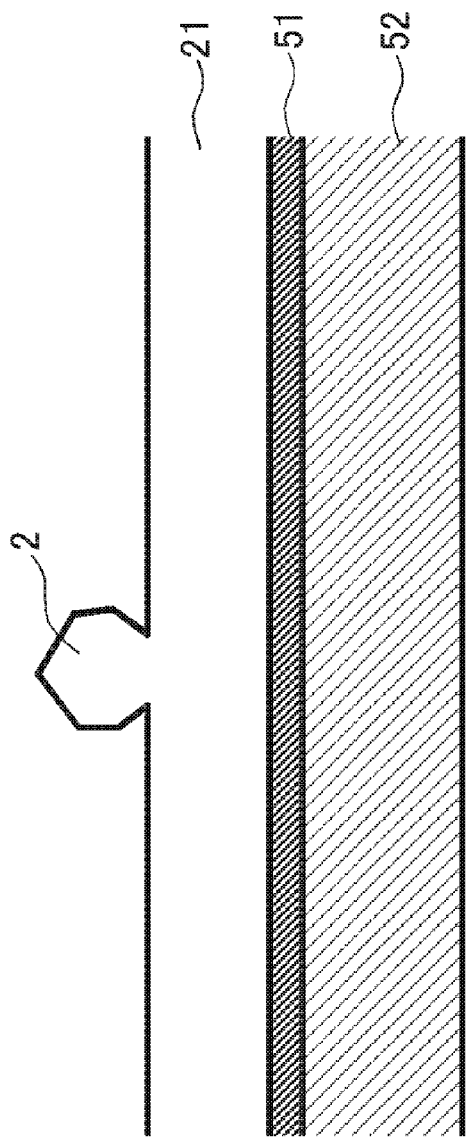
FIG. 6 is a cross-sectional view showing a foreign particle on a pixel electrode.
Figure 7:
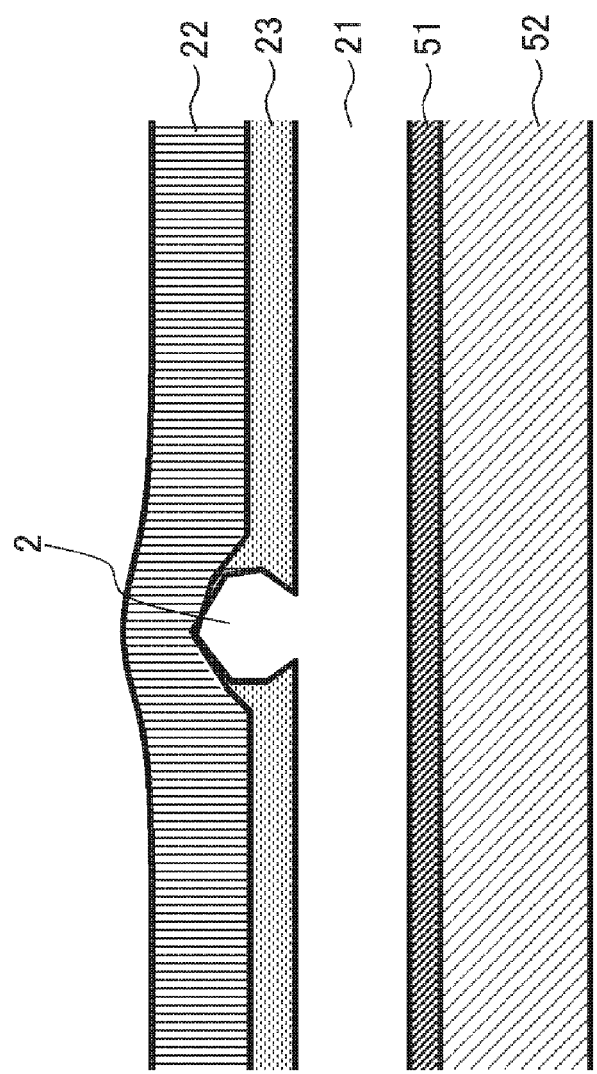
FIG. 7 is a cross-sectional view of an organic layer and a counter electrode that are formed over a pixel electrode having a foreign particle.

FIG. 6 is a cross-sectional view showing a pixel electrode having a foreign particle on the surface. For example, when a counter electrode is formed (as described later) over pixel electrode 21 having a defect due to foreign particle 2 (hereinafter also simply referred to as "defect"), a leakage occurs between pixel electrode 21 and counter electrode 22 via foreign particle 2, as shown in the cross-sectional view of FIG. 7. At this time, current does not pass through organic layer 23, preventing organic layer 23 from emitting light. For this reason, the organic EL element having a defect will be a defective pixel that does not emit light.

In the descriptions of the third step and the fourth step, means for preventing luminance decay caused by such a defect of the pixel electrode will be described.
(3) In the third step, a foreign particle that has contaminated the pixel electrode is detected. There are no particular limitations on the method of detecting a foreign particle contaminating the pixel electrode; the examples include visual inspection using a microscopy, image inspection, and pattern inspection. Examples of the image inspection and the pattern inspection include "die-to-die inspection," in which a defect is detected by comparing mutually adjacent elements, and "die-to-database inspection," in which a defect is detected by comparing elements and the designed data.

When a foreign particle contaminating the pixel electrode is detected, the fourth step is performed, in which the pixel electrode is repaired to prevent a defect such as a short circuit due to the foreign particle. On the other hand, when no foreign particle is detected in the pixel electrode, the fourth step is not performed, but the subsequent manufacturing step of organic EL elements is performed.
(4) In the fourth step, the foreign particle contaminating the pixel electrode has been detected in the third step is pressed into the pixel electrode, and whereby the foreign particle and part of the pixel electrode around the foreign particle are plastic-deformed so that the foreign particle does not protrude from the surface of the pixel electrode.

In order to press the foreign particle contaminating the pixel electrode against the pixel electrode, a fine needle having a hemispherically-shaped tip may be used. For the fine needle for pressing a foreign particle against the pixel electrode, a needle having a sufficiently large diameter with respect to the foreign particle is used. By using this needle, a foreign particle is pressed to completely bury the particle into the pixel electrode. A hard metal material such as tungsten or stainless steel is suitable for the material of the needle.

The fine needle for pressing the foreign particle against the pixel electrode is connected to a controller that can move the needle to any defined positions on the substrate. Further, the fine needle is attached to the shaft that is movable in the vertical direction. The fine needle is moved to the position of the foreign particle contaminating the pixel electrode which has been detected in the third step. Afterward, the needle is lowered such that the tip of the needle is in contact with the foreign particle contaminating the pixel electrode, and then the needle presses the foreign particle to plastic-deform the foreign particle. Then, the needle is moved downward below the surface of the pixel electrode. By this, the foreign particle is pressed against the pixel electrode until the foreign particle is completely plastic-deformed, and also until the part of the pixel electrode around the foreign particle is plastic-deformed to some extent. The required pressing-force against the foreign particle by the needle for plastic-deforming the foreign particle varies depended on the material of the foreign particle and the pixel electrode. Therefore, the pressing force is appropriately adjusted depending on the material of the foreign particle or the pixel electrode.

After the foreign particle is plastic-deformed by the fine needle, the needle is moved upward and confirmation is made whether the foreign particle protruding from the surface of the pixel electrode has been pressed and crushed into the pixel electrode. Because the foreign particle protruding from the surface of the pixel electrode disappears, it is possible to prevent a short circuit between the counter electrode and the pixel electrode from occurring, the counter electrode is formed in a following step.

Further, according to the present embodiment, the pixel electrode may be formed directly on the substrate and not on the insulation film, or alternatively may be formed on a layer of the substrate other than the insulation film. In these cases, the step of forming the insulation film can be omitted or can be substituted with a step of forming other layer.

Further, a method of pressing the foreign particle contaminating the pixel electrode may be a method of pressing a rotating roll against the surface of the substrate on which the pixel electrode is formed, while moving the substrate. Alternatively, it is possible to employ a method of pressing a flat plate against the surface of the substrate on which the pixel electrode is formed, the flat plate having a smooth surface that is larger than the surface of the substrate.

In this way, according to the present embodiment, it is possible to simply prevent a short circuit due to a foreign particle. Therefore, according to the present embodiment, it is possible to reduce the defects of organic EL elements inexpensively, making it possible to manufacture high-quality organic EL elements with a high yield.

2. Organic EL Display According to the Present Embodiment

An organic EL display according to the present embodiment is manufactured by a method of manufacturing an organic EL display including the above repairing method. The organic EL display according to the present embodiment is top emission type and active matrix type, and includes a TFT substrate and organic EL elements arranged in the form of matrix on the TFT substrate.

The TFT substrate includes a drive circuit for making organic EL elements emit light, the drive circuit including thin film transistors (hereinafter simply referred to as "TFTs") arranged in the form of matrix.

Examples of the material of the substrate on which TFTs are formed include silicon carbide (SiC), alumina ($Al_2O_3$), aluminum nitride (AlN), glass, silicon, and a germanium wafer. Each of the TFTs includes a source electrode and a drain electrode, a channel composed of a semiconductor layer that connects the source electrode and the drain electrode, a gate electrode that controls the channel flowing, and a gate insulation film that insulates the gate electrode from the source electrode and the drain electrode.

The TFT substrate may include insulation film 51 as planarization film on the TFT substrate. The material of the insulation film is not limited so long as it is insulating; the examples include acrylic resins and polyimide.

The organic EL element includes a pixel electrode arranged on the insulation film formed on the TFT substrate, an organic functional layer arranged on the pixel electrode, and a counter electrode arranged on the organic functional layer. Further, the organic EL element may include a bank for defining the organic functional layer.

The pixel electrode is a conductive member. The pixel electrode typically functions as an anode, but may function as a cathode. Further, the pixel electrode is preferably light-reflective. Examples of the material of such a pixel electrode include silver-palladium-copper (APC) alloys, silver-rubidium-gold (ARA) alloys, molybdenum-chrome (MoCr) alloys, and nickel-chrome (NiCr) alloys. The pixel electrode may be connected to the drain electrode or the source electrode of a TFT via a contact hole provided in the insulation film of the TFT panel.

The organic functional layer includes the organic EL layer containing an organic EL material. The organic EL material contained in the organic EL layer is preferably a polymer organic EL material that can form the organic EL layer by coating. Examples of such a polymeric organic EL material include polyphenylenevinylene and its derivatives, polyacetylene and its derivatives, polyphenylene and its derivatives, polyparaphenylene ethylene and its derivatives, poly-3-hexylthiophene and its derivatives, and polyfluorene and its derivatives.

The organic EL layer can emit either of a red, green or blue light according to the arranged position of the organic EL element. The organic functional layer may further include, for example, a hole injection layer, a hole transport layer, and an electron transport layer.

The bank is a insulation partition wall for defining the organic functional layer. The bank may be formed by patterning a resist film made of a photosensitive material with exposure and development.

The counter electrode is a conductive member arranged on the organic functional layer. The counter electrode typically functions as a cathode, but may function as an anode. The counter electrode preferably has light transmittance. Examples of the material of such a counter electrode include ITO and IZO. The counter electrode has a thickness of around 100 nm.

According to the above embodiment, as shown in the cross-sectional view of FIG. 6, a foreign particle 2 may contaminate pixel electrode 21. When the pixel electrode is formed by sputtering or vapor deposition, a foreign particle such as a particle made of electrode material or dirt in the apparatus can contaminate pixel electrode 21. The foreign particle can have a size so as to cause a short circuit between the pixel electrode and the counter electrode, but the size and type of the foreign particle are not limited.

A feature of the present embodiment lies in that the foreign particle and part of the pixel electrode are plastic-deformed by pressing a fine needle having, for example, a hemispherically-shaped tip against the foreign particle contaminating the pixel electrode. Because the foreign particle protruding from the surface of the pixel electrode is plastic-deformed and pressed into the pixel electrode, a short circuit between the counter electrode and the pixel electrode due to the foreign particle cannot occur.

Hereinafter, embodiments of the repairing method of the present embodiment will be described with reference to the accompanying drawings, but the present embodiment is not limited to these embodiments.

(Embodiment 1)

Hereinafter, the fourth step, which is the step after the third step, will be described assuming that the foreign particle contaminating the pixel electrode has been detected in the third step. Materials of the pixel electrode and the foreign particle are aluminum.

Figure 1:
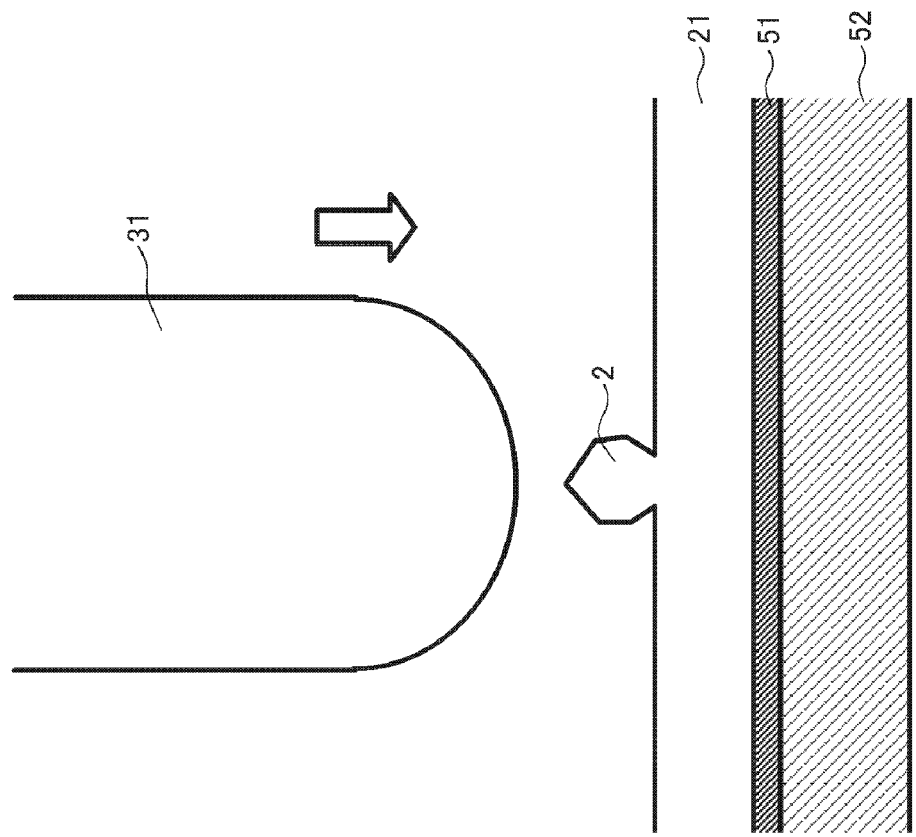
FIG. 1 is a cross-sectional view of a fine needle for pressing a foreign particle into a pixel electrode according to a first exemplary embodiment.

A fine needle made of tungsten is moved to the position of the foreign particle detected in the third step. FIG. 1 shows a state in which a needle made of tungsten is moved to the position of a foreign particle. A diameter of the hemispherical section of the fine needle can be two to five times diameter of a foreign particle, the diameter of the hemispherical section being a diameter at the bottom of the hemispherical section. For example, when the size of a foreign particle is 1 to 10 μm, the diameter of the hemispherical section of the needle can be 2 to 50 μm. The tip of needle 31 (tip of the fine needle having a hemispherically-shaped tip) is processed into a hemispherical shape by electrical discharge machining. The tip of the needle is moved downward such that the tip is in contact with foreign particle 2 contaminating pixel electrode 21, and is pressed against foreign particle 2 for plastic deformation.

Figure 2:
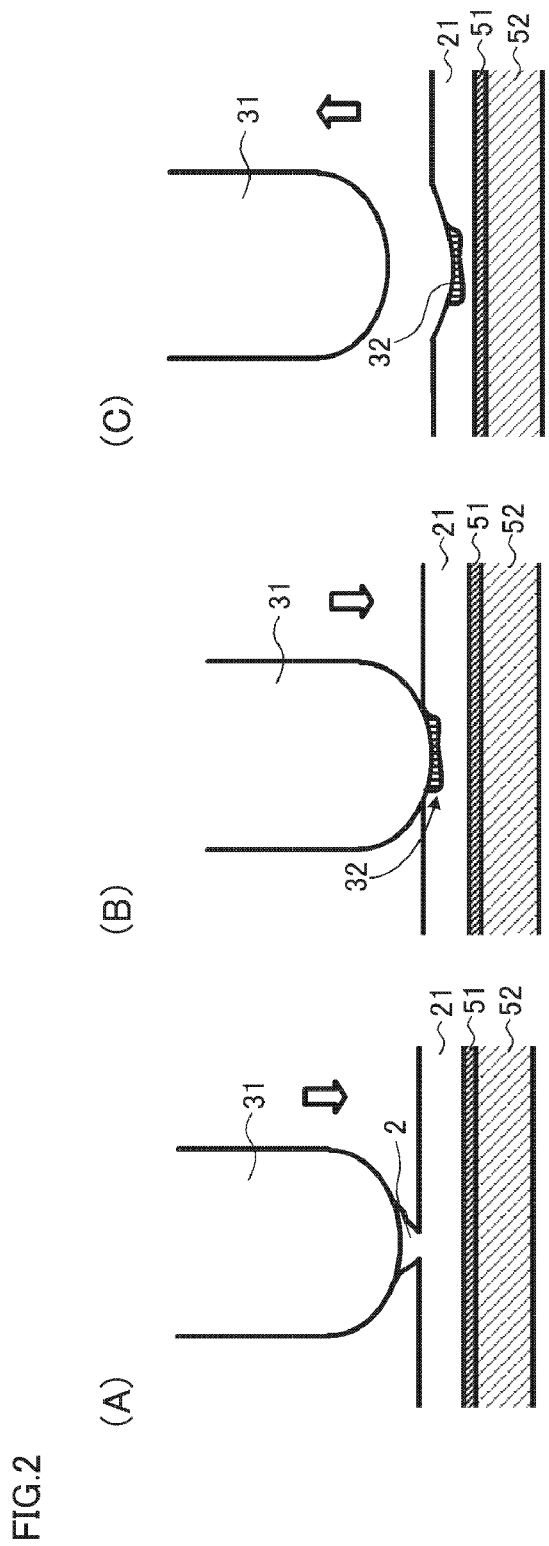
FIGS. 2A to 2C are a cross-sectional view showing a process in which a foreign particle is being pressed into a pixel electrode according to the first embodiment.

FIG. 2A shows a state in which a foreign particle is being deformed. Aluminum undergoes plastic deformation when it receives a force of 20 $kg/mm^2$ (196 MPa) or greater. Therefore, when the tip of needle 31 is moved downward, the tip of needle 31 is pressed against foreign particle 2 with a force of 20 $kg/mm^2$ or greater. And also, the fine needle is pressed into the pixel electrode to such an extent that the fine needle does not penetrate the pixel electrode.

The tip of needle 31 is moved downward until foreign particle 2 is completely plastic-deformed as shown in FIG. 2B, and then the tip of needle 31 is moved upward as shown in FIG. 2C. Then, confirmation is made whether foreign particle 2 protruding from the surface of pixel electrode 21 has been pressed and crushed into the pixel electrode or not, that is, whether foreign particle 32 that has been pressed to be plastic-deformed is formed or not.

Figure 8:
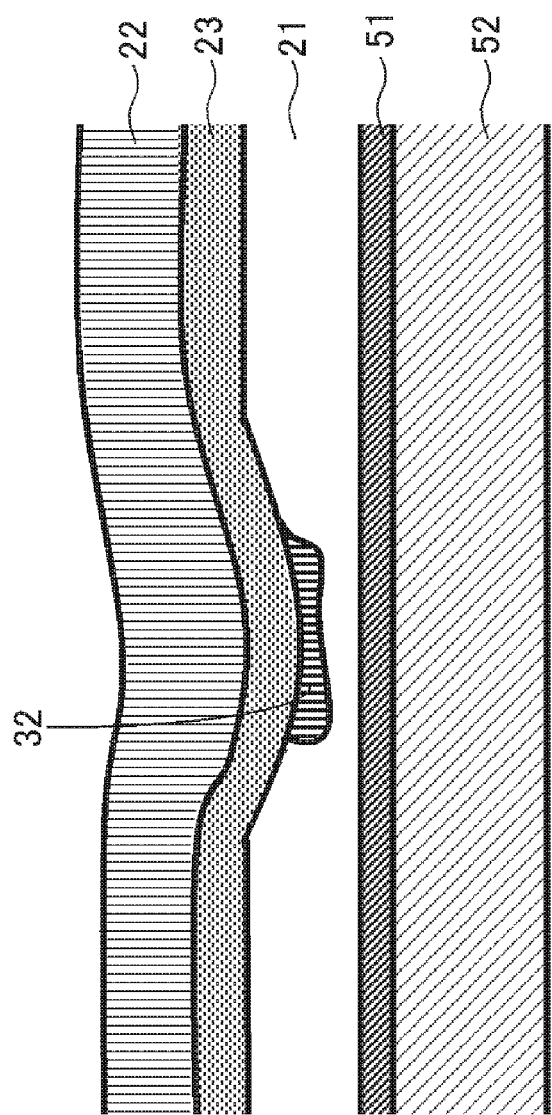
FIG. 8 is a cross-sectional view of an organic layer and a counter electrode that are formed over a pixel electrode into which a foreign particle has been pressed.
Figure 9:
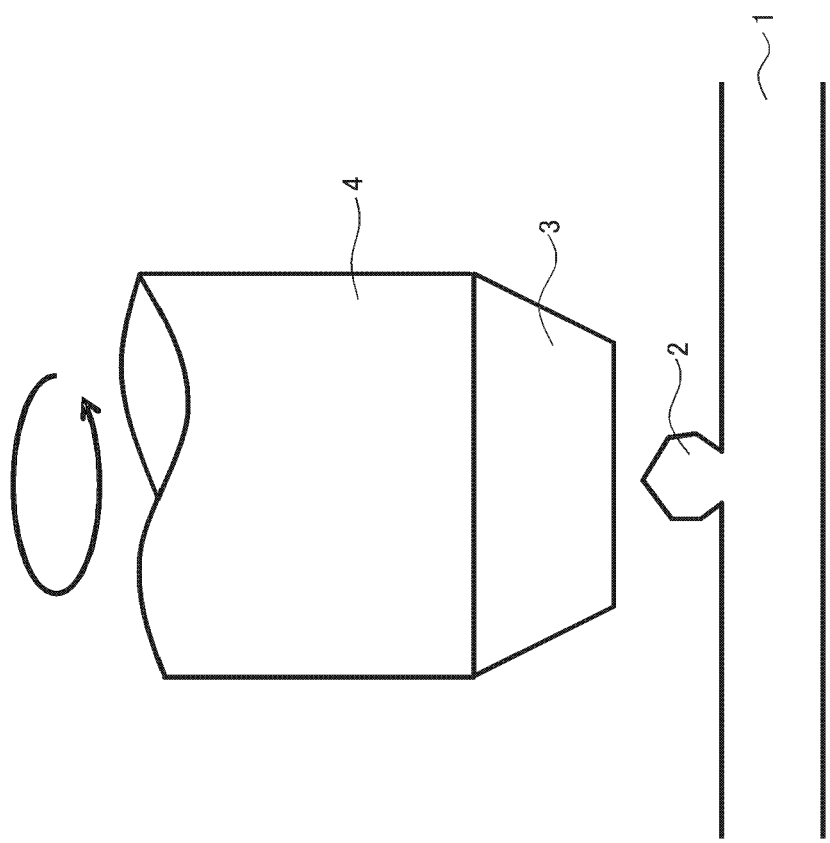
FIG. 9 shows a conventional method of removing a foreign particle using a rotation tool having a roughened grinding surface on its tip.
Figure 10:
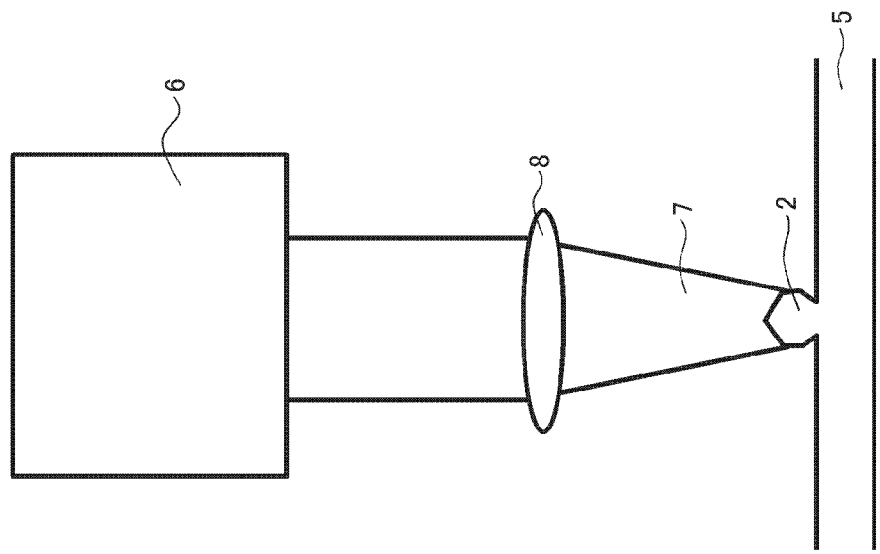
FIG. 10 shows a conventional method of removing a foreign particle with laser.
Figure 11:
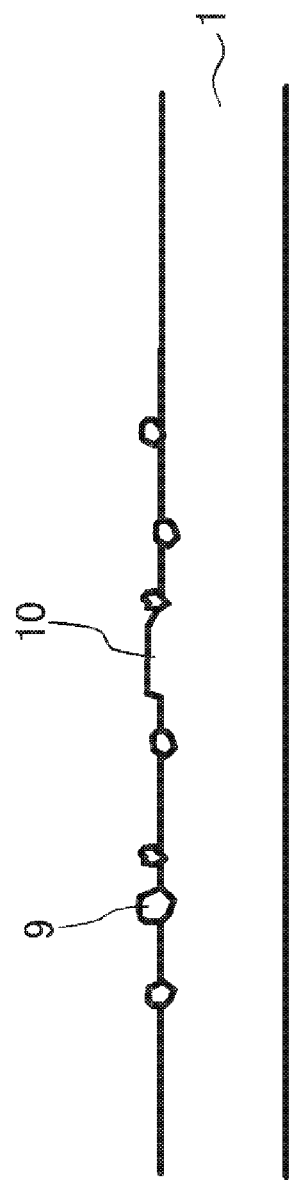
FIG. 11 shows an electrode after a foreign particle has been removed by a conventional method using a rotation tool having a roughened grinding surface on its tip.
Figure 12:
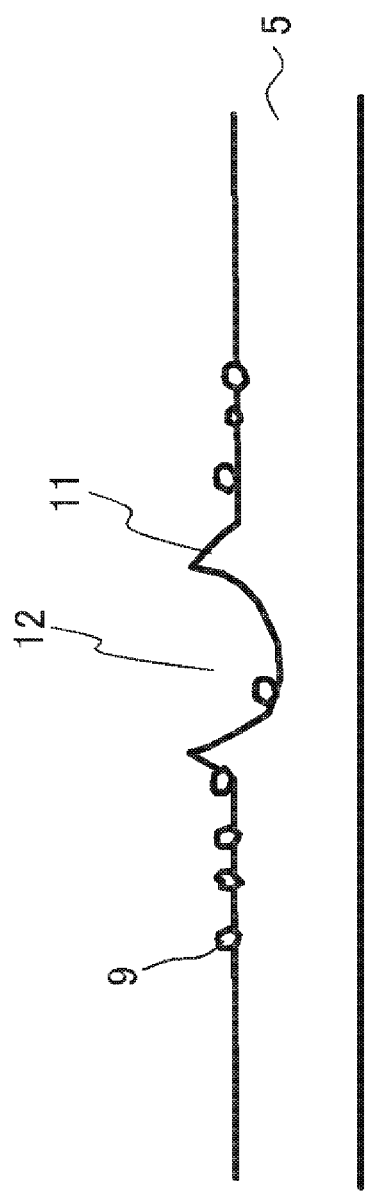
FIG. 12 shows an organic layer after a foreign particle has been removed by a conventional method with laser.

Because the tip of the fine needle has a hemispherical shape, even when part of pixel electrode 21 is deformed to some extent, the deformed part has a smooth surface. FIG. 8 is a cross-sectional view showing an organic layer and a counter electrode that are formed after a foreign particle is pressed into the pixel electrode using a fine needle. As shown in FIG. 8, organic layer 23 and counter electrode 22 can be formed continuously all over the pixel electrode in which a foreign particle has been pressed using a fine needle. Further, organic layer 23 and counter electrode 22 are formed, as result it is possible to prevent a short circuit due to the foreign particle.

In this way, by pressing the fine needle against the foreign particle, it is possible to simply repair the pixel electrode without adversely affecting the pixel electrode at around the defect.

The repairing method of Embodiment 1 in which a fine needle is pressed against a foreign particle can be employed not only just after the pixel electrode formation step, but also after the bank formation step.

(Embodiment 2)

Embodiment 2 describes an embodiment where a foreign particle in a pixel electrode is pressed and crushed using a rotating roll, so as to plastic-deform the foreign particle.

After pixel electrode are formed, a roll having a smooth surface covered with a hard layer is rotated while contacting with TFT substrate 52 having the pixel electrodes. The width of the roll is preferably greater than that of TFT substrate 52. The edges of the roll having a greater width than that of TFT substrate 52 cannot make contact with TFT substrate 52, therefore, preventing a difference in level on TFT substrate 52 from generating. Therefore, discontinuity of the organic layer caused by such difference in level will not occur.

Figure 3:
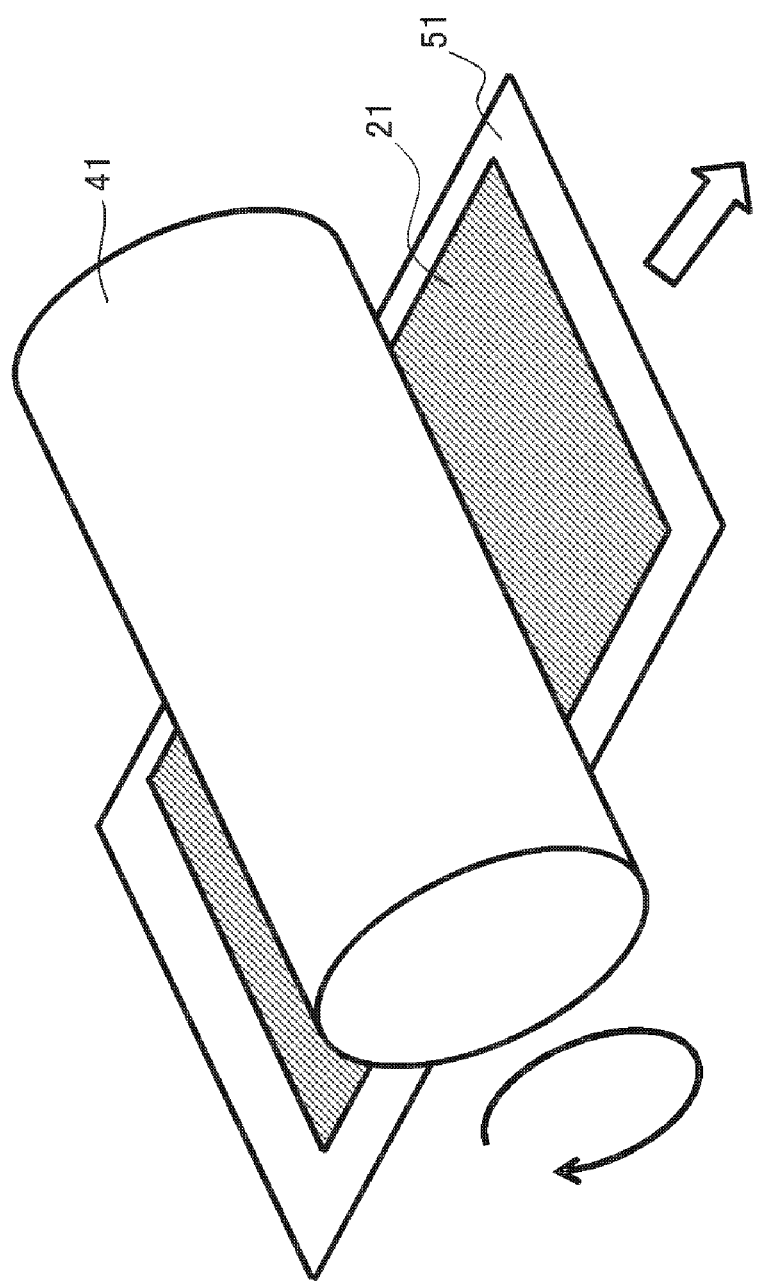
FIG. 3 is a perspective view showing a rotation roll arranged on a substrate according to a second exemplary embodiment.
Figure 4:
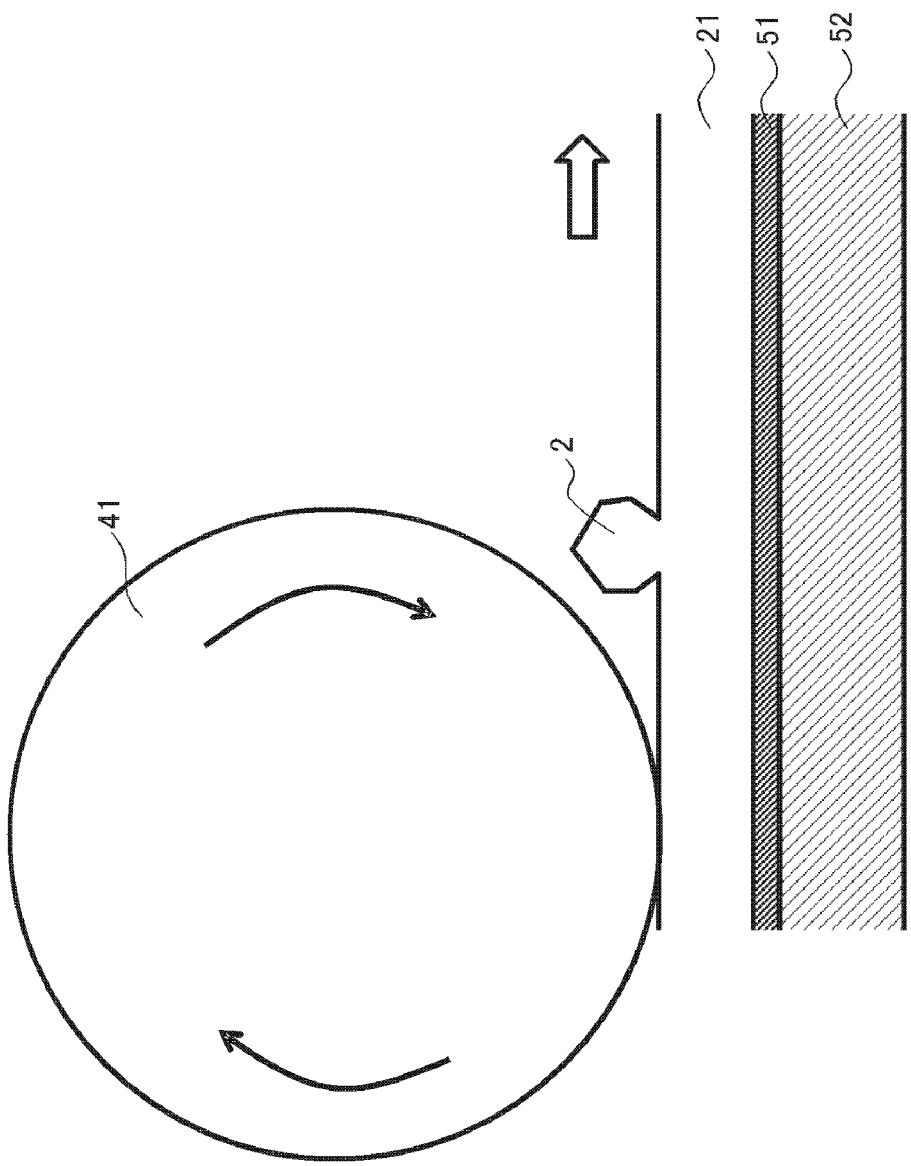
FIG. 4 is a cross-sectional view showing a rotation roll and a foreign particle according to the second embodiment.
Figure 5:
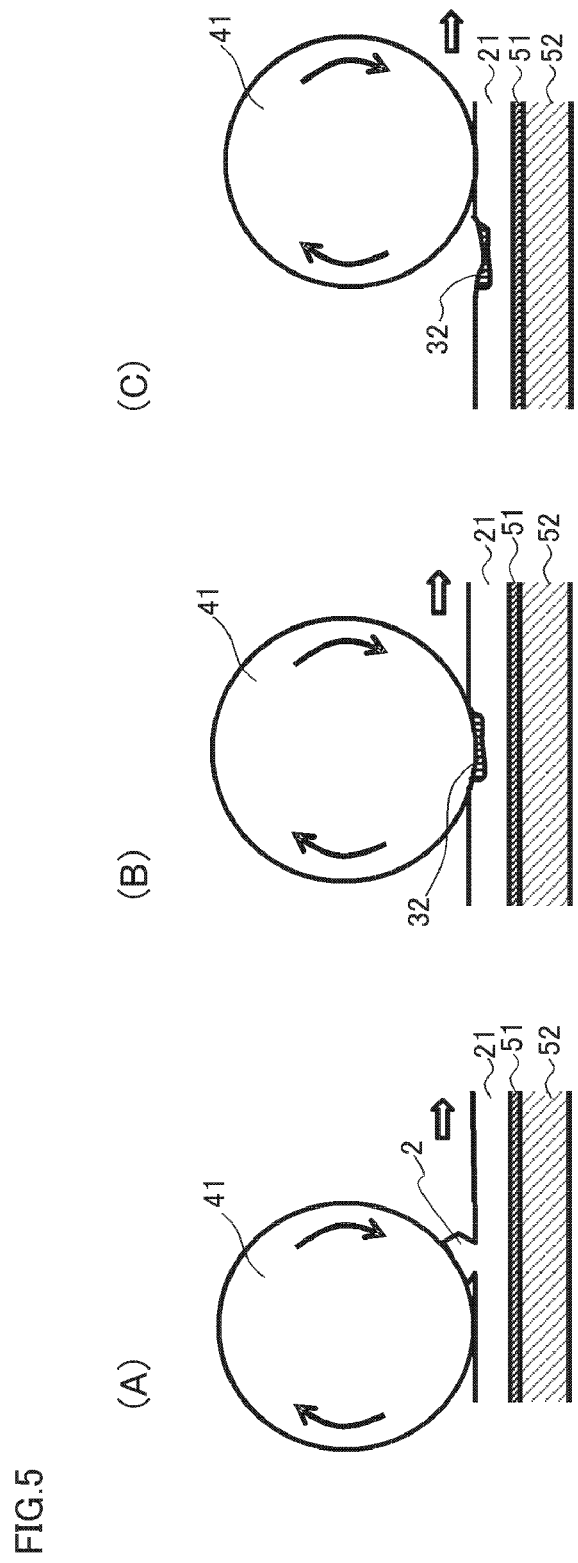
FIGS. 5A to 5C are a cross-sectional view showing a process in which a foreign particle is pressed into a pixel electrode using a rotation roll according to the second embodiment.

After the rotating roll is made in contact with TFT substrate 52, the roll is pressed against TFT substrate 52 while relatively moving TFT substrate 52 with respect to the roll. In this way, the roll is pressed against the surface of TFT substrate 52. FIG. 3 is a perspective view showing a roll pressed against TFT substrate 52. FIG. 4 is a cross-sectional view showing TFT substrate 52 and the roll. By pressing rotation roll 41 against TFT substrate 52, foreign particle 2 protruding from the surface of pixel electrode 21 is pressed and crushed so as to be plastic-deformed, in order of FIGS. 5A, 5B and 5C. In this way, foreign particles protruding from the surface of the pixel electrode can be reduced.

By sandwiching TFT substrate 52 by a pair of rolls while relatively moving TFT substrate 52 with respect to the rolls, a foreign particle on the pixel electrode on TFT substrate 52 may be pressed and crushed.

Because, in a repairing method according to the present Embodiment 2 in which a foreign particle is pressed and crushed, a rotation roll is pressed against the surface of TFT substrate 52 having pixel electrodes, it is not necessary to perform the third step of detecting foreign particles. For this reason, it is possible to repair an organic EL display more simply and efficiently. Further, the present embodiment is suitable as a repairing method during manufacture of displays having a large substrate and manufacture of organic EL lighting.

INDUSTRIAL APPLICABILITY

According to the method of repairing an organic EL display of the above embodiments, when a foreign particle contaminates a pixel electrode and thus a defect is formed, the foreign particle is pressed into the pixel electrode using, for example, a fine needle. Therefore, it is possible to locally repair the defect due to the foreign particle protruding from the pixel electrode. Thus, it is possible to reduce a leakage current of an organic EL display, making it possible to prevent the reduction of light emission and to reduce power consumption. Further, it is possible to manufacture organic EL displays with a high yield.

Further, in addition to the repair of an organic EL display, the above embodiments are also applicable to, for example, manufacture of devices that require a repair in which a short circuit caused by, for example, a foreign particle in the electrode is locally insulated.

The invention claimed is:

1. A method of repairing an organic EL display, the method applied for manufacturing an organic EL display having a substrate having a drive circuit with TFTs and multiple organic EL elements arranged in the form of matrix on the substrate,
    each of the organic EL elements including a pixel electrode arranged on the substrate, an organic layer arranged on the pixel electrode and a counter electrode arranged on the organic layer, the method comprising:
    forming the pixel electrode on the substrate at a position of each of the organic EL elements;
    detecting a foreign particle that has contaminated the pixel electrode; and
    pressing the foreign particle into the pixel electrode.

2. The method of repairing the organic EL display according to claim 1, wherein when pressing the foreign particle into the pixel electrode,
    a fine needle having a hemispherically-shaped tip is moved downward toward the foreign particle such that the foreign particle and part of the pixel electrode are plastic-deformed together to bury the foreign particle into the pixel electrode.

3. The method of repairing the organic EL display according to claim 1, wherein when pressing the foreign particle into the pixel electrode,
    a roll is pressed against a surface of the substrate while relatively moving the substrate with respect to the roll such that the foreign particle that has protruded from the pixel electrode is plastic-deformed to make a surface of the pixel electrode flat.

4. The method of repairing an organic EL display according to claim 1, further comprising forming an insulation film on the substrate,
    wherein when forming the pixel electrode on the substrate, the pixel electrode is formed on the insulation film at a position of each of the organic EL elements.

5. A method of repairing an organic EL display, the organic EL display having a substrate and a drive circuit with TFTs, the method comprising:
    forming a plurality of pixel electrodes on the substrate in the form of a matrix on the substrate;
    pressing a foreign particle that has contaminated the pixel electrode into the pixel electrode; and
    forming an organic layer arranged on each of the plurality of pixel electrodes and a counter electrode arranged on the organic layer.

6. The method of repairing the organic EL display according to claim 1, wherein the pressing of the foreign particle into the pixel electrode further includes pressing a roll against a surface of the substrate while relatively moving the substrate with respect to the roll such that the foreign particle that has protruded from the pixel electrode is plastic-deformed to make a surface of the pixel electrode flat.

* * * * *